United States Patent
Schmitt et al.

(10) Patent No.: US 8,927,429 B2
(45) Date of Patent: Jan. 6, 2015

(54) CHEMICAL MECHANICAL POLISHING (CMP) COMPOSITION COMPRISING A SPECIFIC HETEROPOLYACID

(75) Inventors: Christine Schmitt, Mannheim (DE); Andrey Karpov, Mannheim (DE); Frank Rosowski, Mannheim (DE); Mario Brands, Frankenthal (DE); Yuzhuo Li, Heidelberg (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/877,759

(22) PCT Filed: Oct. 4, 2011

(86) PCT No.: PCT/IB2011/054357
§ 371 (c)(1),
(2), (4) Date: Apr. 4, 2013

(87) PCT Pub. No.: WO2012/046185
PCT Pub. Date: Apr. 12, 2012

(65) Prior Publication Data
US 2013/0189842 A1    Jul. 25, 2013

Related U.S. Application Data

(60) Provisional application No. 61/389,740, filed on Oct. 5, 2010, provisional application No. 61/473,831, filed on Apr. 11, 2011.

(51) Int. Cl.
*H01L 21/306* (2006.01)
*H01L 21/321* (2006.01)
*C09G 1/02* (2006.01)

(52) U.S. Cl.
CPC ...... *H01L 21/30625* (2013.01); *H01L 21/3212* (2013.01); *C09G 1/02* (2013.01)
USPC ........................................ 438/692; 252/79.2

(58) Field of Classification Search
None
See application file for complete search history.

(56) References Cited

U.S. PATENT DOCUMENTS

| | | | |
|---|---|---|---|
| 4,954,142 A | 9/1990 | Carr et al. | |
| 6,050,885 A | 4/2000 | Morsch et al. | |
| 6,093,091 A | 7/2000 | Keller | |
| 6,527,818 B2 | 3/2003 | Hattori et al. | |
| 6,767,276 B2 | 7/2004 | Keller | |
| 7,207,871 B1 | 4/2007 | Zuniga et al. | |
| 7,435,162 B2 | 10/2008 | Kollodge | |
| 2008/0315153 A1 | 12/2008 | Kollodge | |
| 2008/0315154 A1 | 12/2008 | Kollodge | |
| 2009/0130849 A1* | 5/2009 | Lee ............................... 438/693 |
| 2012/0071671 A1 | 3/2012 | Karpov et al. | |

FOREIGN PATENT DOCUMENTS

| | | |
|---|---|---|
| EP | 1 123 956 | 8/2001 |
| JP | 2002 299292 | 10/2002 |
| JP | 2002-299292 A | 10/2002 |
| JP | 2005 223257 | 8/2005 |
| JP | 2005-223260 A | 8/2005 |
| JP | 2006-223257 A | 8/2005 |
| RU | 2 165 406 C1 | 4/2001 |
| WO | 2004 063301 | 7/2004 |

OTHER PUBLICATIONS

U.S. Appl. No. 13/877,798, filed Apr. 4, 2013, Drescher et al.
European Search Report Issued Feb. 24, 2011 in Patent Application No. 10 18 6600.
International Search Report Issued Jan. 5, 2012 in PCT/IB2011/054357.
V.F. Odyakov et al., "Synthesis of molybdovanadophosphoric heteropoly acid solutions having modified composition", Applied Catalysis A: General, XP 002624186, vol. 342, 2008, pp. 126-130 and cover page.
International Search Report Issued Jan. 5, 2012 in PCT/IB11/54357 Filed Oct. 4, 2011.

\* cited by examiner

*Primary Examiner* — Allan Olsen
(74) *Attorney, Agent, or Firm* — Oblon, Spivak, McClelland, Maier & Neustadt, L.L.P.

(57) ABSTRACT

A chemical mechanical polishing (CMP) composition comprising a specific heteropolyacid Abstract A chemical-mechanical polishing (CMP) composition comprising: (A) inorganic particles, organic particles, or a mixture thereof, (B) a heteropolyacid of the formula $H_aX_bP_sMo_yV_zO_c$ wherein X=any cation other than H $8<y<18$ $8<z<14$ $56<c<105$ $a+b=2c-6y-5(3+z)$ $b>0$ and $a>0$ (formula I) or a salt thereof, and, (C) an aqueous medium.

15 Claims, No Drawings

CHEMICAL MECHANICAL POLISHING (CMP) COMPOSITION COMPRISING A SPECIFIC HETEROPOLYACID

This application is a National Stage of PCT/IB11/054357 filed Oct. 4, 2011 and claims the benefit of U.S. application Ser. No. 61/389,740 filed Oct. 5, 2010 and U.S. application Ser. No. 61/473,831 filed Apr. 11, 2011.

This invention essentially relates to a chemical mechanical polishing (CMP) composition and its use in polishing substrates of the semiconductor industry. The CMP composition according to the invention comprises a specific heteropolyacid and shows an improved polishing performance.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP slurry or CMP composition. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP slurry or CMP composition is usually applied between the to-be-polished wafer and the polishing pad.

In the state of the art, CMP compositions comprising a heteropolyacid are known and described, for instance, in the following references.

U.S. Pat. No. 6,527,818 B2 discloses an aqueous dispersion for CMP comprising an abrasive, water and a heteropolyacid. This dispersion was described for the CMP of tungsten substrates.

JP-A-2005-223257 discloses an aqueous dispersion for CMP comprising a heteropolyacid, an anionic surfactant, polishing particles (abrasive), and water. The heteropolyacid used was for example PVM-1-11 from Nippon Inorganic Colour & Chemical Co., Ltd. This aqueous dispersion was particularly appropriate for the CMP of copper substrates. According to the analytical characterization done by the applicant, PVM-1-11 has the formula $H_4P_1Mo_{11}V_1O_{40}$, and if normalized to $P_3$, PVM-1-11 has the formula $H_{12}P_3Mo_{33}V_3O_{120}$. For details, see the experimental section.

One of the objects of the present invention was to provide a CMP composition which has a long shelf-life. Furthermore, a CMP composition was thought which is characterized by high material removal rates (MRRs). Moreover, CMP compositions were contemplated that has a high selectivity between the removal of substrate comprising tungsten and any other substrates in a multi-level structure. In addition, a further object was to provide a CMP composition which is particularly appropriate and adopted for the CMP of substrates comprising copper and/or tungsten.

Furthermore, a respective CMP process was to be provided.

Accordingly, a CMP composition was found which comprises (A) inorganic particles, organic particles, or a mixture thereof, (B) a heteropolyacid of the empirical formula

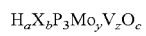

$$H_aX_bP_3Mo_yV_zO_c$$

wherein X=any cation other than H $8 \leq y \leq 18$ $8 \leq z \leq 14$ $56 \leq c \leq 105$ $a+b=2c-6y-5(3+z)$ $b \geq 0$ and $a > 0$     (formula I)

or a salt thereof, and (C) an aqueous medium.

In addition, the above-mentioned objects of the invention are achieved by a process for the manufacture of a semiconductor device comprising the polishing of a substrate comprising tungsten in the presence of said CMP composition.

Moreover, the use of the CMP composition of the invention for polishing substrates which are used in the semiconductor industry has been found, which fulfills the objects of the invention.

Preferred embodiments are explained in the claims and the specification. It is understood that combinations of preferred embodiments are within the scope of the present invention.

According to the invention, a semiconductor device can be manufactured by a process which comprises the chemical mechanical polishing of a substrate in the presence of a CMP composition comprising (A) inorganic particles, organic particles, or a mixture thereof, (B) a heteropolyacid of formula I, or a salt thereof, and (C) an aqueous medium.

Preferably, said process comprises the chemical mechanical polishing of a substrate comprising a metal layer. More preferably, said process comprises the chemical mechanical polishing of a substrate comprising a tungsten and/or copper layer. Most preferably, said process comprises the chemical mechanical polishing of a substrate comprising a tungsten layer.

According to the invention, a CMP composition comprising (A) inorganic particles, organic particles, or a mixture thereof, (B) a heteropolyacid of formula I, or a salt thereof, and (C) an aqueous medium is used for polishing any substrate used in the semiconductor industry. Preferably, said CMP composition is used for polishing a substrate comprising a metal layer. More preferably, said CMP composition is used for polishing a substrate comprising a tungsten and/or copper layer. Most preferably, said CMP composition is used for polishing a substrate comprising a tungsten layer.

According to the invention, the CMP composition contains inorganic particles, organic particles, or a mixture thereof (A). A composite particle, i.e. a particle comprising two or more types of particles in such a way that they are mechanically, chemically or in another way bound to each other, is considered as being a mixture of these two types of particles. (A) can be of one type or a mixture of different types of inorganic particles, or (A) can be of one type or a mixture of different types of organic particles, or (A) can be a mixture of one or more types of inorganic particles and one or more types of organic particles.

Generally, the particles (A) can be contained in varying amounts. Preferably, the amount of (A) is not more than 10 percent by weight, more preferably not more than 4 percent by weight, most preferably not more than 2 percent by weight, based on the total weight of the corresponding composition. Preferably, the amount of (A) is at least 0.01 percent by weight, more preferably at least 0.07 percent by weight, most preferably at least 0.5 percent by weight, based on the total weight of the corresponding composition.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (D) and can be determined using dynamic light scattering techniques. Then, the d50 values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is in the range of from 5 to 500 nm, more preferably in the range of from 5 to 250 nm, most preferably in the range of from 50 to 150 nm, and in particular in the range of from 90 to 130 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture of particles of different chemical nature. As a rule, particles (A) of the same chemical nature are preferred. Generally, (A) can be inorganic particles such as a metal, a metal oxide or carbide, including a metalloid, a metalloid oxide or carbide, or organic particles such as polymer particles, a mixture of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures thereof. Most preferably, particles (A) are alumina, ceria, silica, titania, zirconia, or mixtures thereof. In particular, (A) are silica. For example, (A) are colloidal silica. Generally, colloidal silica are fine amorphous, non-porous, and typically spherical silica particles.

In another embodiment in which (A) are organic particles, or a mixture of inorganic and organic particles, polymer particles are preferred. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacrylates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures thereof. Among them, polymer particles with a cross-linked structure are preferred.

According to the invention, the CMP composition contains a heteropolyacid (B) of the empirical formula $$H_aX_bP_3Mo_yV_zO_c$$

wherein X=any cation other than H

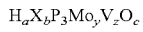

$8 \leq y \leq 18$ $8 \leq z \leq 14$ $56 \leq c \leq 105$ $a+b=2c-6y-5(3+z)$ $b \geq 0$ and $a > 0$         (formula I)

or a salt thereof. (B) can be of one type or a mixture of different types of such hetero-polyacids or salts thereof.

Preferably, the heteropolyacid or a salt thereof (B) is a heteropolyacid of the empirical formula $$H_aX_bP_3Mo_yV_zO_c$$

wherein X=any cation other than H

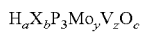

$12 \leq y \leq 18$ $10 \leq z \leq 14$ $85 \leq c \leq 100$ $a+b=2c-6y-5(3+z)$ $b \geq 0$ and $a > 0$         (formula II)

or a salt thereof.

More preferably, the heteropolyacid or a salt thereof (B) is a heteropolyacid of the empirical formula $$H_aX_bP_3Mo_yV_zO_c$$

wherein X=organic or inorganic ammonium cation

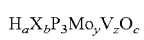

$14 \leq y \leq 18$ $10 \leq z \leq 14$ $88 \leq c \leq 100$ $a+b=2c-6y-5(3+z)$ $b \geq 0$ and $a > 0$         (formula III)

or a salt thereof.

Generally, the heteropolyacid or a salt thereof (B) can be contained in varying amounts. preferably, the amount of (B) is from 0.01 to 15 percent by weight, more preferably from 0.05 to 10 percent by weight, most preferably from 0.01 to 5 percent by weight, for example from 0.4 to 2.5 percent by weight, based on the total weight of the corresponding composition.

Generally, the parameter b in the formulas I, II, or III of (B), which represents the number of cations X+, can be either 0 or greater than 0. Preferably, this parameter b is greater than 0. More preferably, this parameter b is from 1 to 15. Most preferably, this parameter b is from 2 to 12. In particular, this parameter b is from 3 to 9. For example, this parameter b is from 4 to 6.

In case the parameter b in the formulas I, II, or III of (B) is greater than 0, (B) comprises X as a cation. In the formulas I, II, or III of (B), the cation X can be any cation other than proton (H). Generally, the cation X can be of various chemical natures. X may be of the same chemical nature or a mixture of cations of different chemical nature. As a rule, cations X of the same chemical nature are preferred. Preferably, X is a metal cation, an inorganic or organic ammonium cation, a phosphonium cation, a heterocyclic cation, or an homocyclic cation. More preferably, X is a metal cation, an inorganic or organic ammonium cation. Most preferably, X is an inorganic or organic ammonium cation. In particular, X is an $NH_4+$ cation, or a mono-, di-, tri- or tetraalkylammonium cation. For example, X is an $NH_4+$ cation.

A heterocyclic cation is a cationic cyclic compound with two different chemical elements as ring members atoms. A homocyclic cation is a cationic cyclic compound with one chemical element as ring members atoms. An organic ammonium cation is a cationic organic compound containing a positively charged nitrogen atom. An inorganic ammonium cation is a cationic inorganic compound containing a positively charged nitrogen atom.

According to the invention, the CMP composition contains an aqueous medium (C). (C) can be of one type or a mixture of different types of aqueous media.

In general, the aqueous medium (C) can be any medium which contains water. Preferably, the aqueous medium (C) is a mixture of water and an organic solvent miscible with water (e.g. an alcohol, preferably a $C_1$ to $C_3$ alcohol, or an alkylene glycol derivative). More preferably, the aqueous medium (C) is water. Most preferably, aqueous medium (C) is de-ionized water. If the amounts of the components other than (C) are in total x% by weight of the CMP composition, then the amount of (C) is (100−x)% by weight of the CMP composition.

The properties of the CMP compositions used or according to the invention respectively, such as stability and polishing performance, may depend on the pH of the corresponding composition. Preferably, the pH value of the compositions used or according to the invention respectively is in the range of from 0 to 5, more preferably from 0 to 3.5, and most preferably from 0.5 to 2.5.

The CMP compositions used or according to the invention respectively may also contain, if necessary, various other additives, including but not limited to pH adjusting agents, stabilizers, surfactants, corrosion inhibitors. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 percent by weight, more preferably not more than 5 percent by weight, most preferably not more than 2 percent by weight, for example not more than 1 percent by weight, based on the total weight of the corresponding composition. Preferably, the amount of said additive is at least 0.001 percent by weight, more preferably at least 0.005 percent by weight, most preferably at least 0.02 percent by weight, for example at least 0.05 percent by weight, based on the total weight of the corresponding composition.

According to one embodiment, the CMP composition of the invention comprises
(A) alumina, ceria, silica, titania, zirconia, or a mixture thereof,
(B) a heteropolyacid of formula I, or a salt thereof, in an amount of from 0.1% to 5% by weight of the CMP composition, and
(C) water.

According to a further embodiment, the CMP composition of the invention comprises
(A) polymer particles,
(B) a heteropolyacid of formula I, or a salt thereof, in an amount of from 0.1% to 5% by weight of the CMP composition, and
(C) water.

According to a further embodiment, the CMP composition of the invention comprises
(A) alumina, ceria, silica or a mixture thereof,
(B) a heteropolyacid of formula II, or a salt thereof, in an amount of from 0.1% to 5% by weight of the CMP composition,
(C) water.

According to a further embodiment, the CMP composition of the invention comprises
(A) silica,
(B) a heteropolyacid of formula III, or a salt thereof, in an amount of from 0.1% to 5% by weight of the CMP composition,
(C) water.

Processes for preparing CMP compositions are generally known. These processes may be applied to the preparation of the CMP composition of the invention. This can be carried out by dispersing or dissolving the above-described components (A) and (B) in the aqueous medium (C), preferably water, and optionally by adjusting the pH value through adding an acid, a base, a buffer or an pH adjusting agent. For this purpose the customary and standard mixing processes and mixing apparatuses such as agitated vessels, high shear impellers, ultrasonic mixers, homogenizer nozzles or counterflow mixers, can be used.

The CMP composition of the invention is preferably prepared by dispersing the particles (A), dispersing and/or dissolving a heteropolyacid or a salt thereof (B) in the aqueous medium (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position (as an example for a CMP polisher see U.S. Pat. No. 6,050,885).

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example (hard platen design, see for instance figures in U.S. Pat. Nos. 4,954,142 or 6,093,091), covered with a soft pad that is often called backing film. If more advanced equipment is being used, a flexible membrane that is loaded with air or nitrogen pressure (membrane carriers, for example see U.S. Pat. No. 6,767,276) presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded independently from each other (zone carriers, see for an example U.S. Pat. No. 7,207,871).

For further details reference is made to WO 2004/063301 A1, in particular page 16, paragraph [0036] to page 18, paragraph [0040] in conjunction with the FIG. 2.

By way of the CMP process of the invention and/or using the CMP composition of the invention, wafers with integrated circuits comprising a metal layer can be obtained which have an excellent functionality.

The CMP composition of the invention can be used in the CMP process as ready-to-use slurry, they have a long shelf-life and show a stable particle size distribution over long time. Thus, they are easy to handle and to store. They show an excellent polishing performance, particularly with regard to material removal rate (MRR) and selectivity. For example a high selectivity between tungsten and silicon oxide can be obtained when a substrate comprising tungsten and silicon oxide layers is polished. Since the amounts of its components are held down to a minimum, the CMP compositions used or according to the invention respectively can be used in a cost-effective way.

EXAMPLES AND COMPARATIVE EXAMPLES

Analytical Methods

The elementary analyses of Mo, P and V were measured by ICP-OES (inductively coupled plasma optical emission spectrometry).

All formulas representing the heteropolyacid or a salt thereof were normalized to $P_3$.

V(Ox) is the oxidation state of vanadium and is measured as follows:

100 to 200 mg sample were dissolved in a mixture of 30 mL $H_2SO_4$ 1:1 and 10 mL $H_3PO_4$ (conc.) in the boiling heat under an inert gas atmosphere. The oxidation states were determined using redox titration. Titration is carried out at a potentiograph through a combined platinum electrode.

If the solution only contains $V^{4+}$ and $V^{5+}$, only one potential jump (oxidation from $V^{4+}$ to $V^{5+}$) will be obtained through the titration with $KMnO_4$. If the solution contains $V^{3+}$ and $V^{4+}$, two potential jumps will be obtained during the oxidation.

After the oxidation to $V^{5+}$, the total V was reduced to $V^{4+}$ using 0.1 N $(NH_4)_2Fe(SO_4)_2$.

In order to determine the amount of $V^{5+}$, a reduction to $V^{4+}$ is directly carried out using 0.1 N $(NH_4)_2Fe(SO_4)_2$ after dissolving.

The pH value is measured with a pH electrode (Schott, blue line, pH 0-14/−5 . . . 100° C./3 mol/L sodium chloride).

Inorganic Particles (A')

Silica particles used as inorganic particles (A') are specified in Table 1 and were of NexSil™ (Nyacol), AEROSIL® (Evonik) and LEVASIL® (H.C. Starck) type. NexSil™ 125K (Nyacol) are potassium-stabilized colloidal silica having a typical particle size of 85 nm and a typical surface area of 35 m$^2$/g. NexSil™ 85K (Nyacol) are potassium-stabilized colloidal silica having a typical particle size of 50 nm and a typical surface area of 55 m$^2$/g. NexSil™ 5 (Nyacol) are sodium-stabilized colloidal silica having a typical particle size of 6 nm and a typical surface area of 450 m$^2$/g. NexSil™ 125A (Nyacol) are acidic colloidal silica having a typical particle size of 85 nm and a typical surface area of 35 m$^2$/g. NexSil™ 125NH4 (Nyacol) are ammonia-stabilized colloidal silica having a typical particle size of 85 nm and a typical surface area of 35 m$^2$/g. AEROSIL® 90 (Evonik) are hydrophilic fumed silica having a typical surface area of 90±15 m$^2$/g. LEVASIL® 100 are colloidal silica having a typical mean particle size of 30 nm and a typical surface area of 100 m$^2$/g.

Synthesis of the Heteropolyacid or a Salt Thereof (B')

$H_5PMo_{10}V_2O_{40}$ und $H_7PMo_8V_4O_{40}$ were commercial products from Nippon Inorganic Colour & Chemical Co., Ltd., $H_3PMo_{12}O_{40}$ from Fluka and $H_4SiMo_{12}O_{40}$ from Sigma-Aldrich. The hydrogen peroxide used in the synthesis was a 30% aqueous solution of $H_2O_2$. The molybdenum trioxide used in the synthesis was floury grade $MoO_3$. The phosphoric acid used in the synthesis was a 85% aqueous solution of $H_3PO_4$.

Synthesis Example 1

Synthesis of $H_{17}P_3Mo_{16}V_{10}O_{89}$ 4000 ml deionized water and 492 ml aqueous $H_2O_2$-solution (30%) were cooled down to 2° C. At 2° C. 181.88 g of $V_2O_5$ were added within 1 minute while continuous stirring. After 30 minutes the mixture was warmed up to 18° C. and phosphoric acid (69.17 g, 85%) was added. After stirring for 20 minutes, the reaction mixture was heated up to 40° C. and 461.06 g $MoO_3$ were added. The mixture was heated to 84° C. for 45 minutes. Then, the solution was cooled to room temperature and filtered.

Mo 5.8 g/100 g, V 1.8 g/100 g, P 0.34 g/100 g
V(Ox)=4.89

Synthesis Example 2

Synthesis of $H_{17}P_3Mo_{16}V_{12}O_{94}$ 4000 ml deionized water and 590 ml aqueous $H_2O_2$-solution (30%) were cooled down to 4° C. At 4° C. 218.26 g of $V_2O_5$ were added within 1 minute while continuous stirring. After 30 minutes the mixture was warmed up to 18° C. and phosphoric acid (69.17 g, 85%) was added. After stirring for 20 minutes, the reaction mixture was heated up to 40° C. and 461.06 g $MoO_3$ were added. The mixture was heated to 80° C. for 45 minutes. Then, the solution was cooled to room temperature and filtered.

Mo 5.9 g/100 g, V 2.3 g/100 g, P 0.34 g/100 g
V(Ox)=4.87

Synthesis Example 3

Synthesis of $H_{17}P_3Mo_{16}V_{14}O_{99}$ 1000 ml deionized water and 172 ml aqueous $H_2O_2$-solution (30%) were cooled down to 4° C. At 4° C. 63.66 g of $V_2O_5$ were added within 1 minute while continuous stirring. After 30 minutes the mixture was warmed up to 18° C. and phosphoric acid (17.29 g, 85%) was added. After stirring for 20 minutes, the reaction mixture was heated up to 40° C. and 115.27 g $MoO_3$ were added. The mixture was heated to 80° C. for 45 minutes. Then, the solution was cooled to room temperature and filtered.

Mo 5.8 g/100 g, V 2.6 g/100 g, P 0.30 g/100 g
V(Ox)=4.92

Synthesis Example 4

Synthesis of $H_{17}P_3Mo_{16}V_{12}O_{94}$ and Changing pH Value by Ion Exchange 4000 ml deionized water and 661.25 g of aqueous $H_2O_2$-solution (30%) were cooled down to 4° C. At 4° C. 218.26 g of $V_2O_5$ were added within 1 minute while continuous stirring. After 30 minutes the mixture was warmed up to 18° C. and phosphoric acid (69.17 g, 85%) was added. After stirring for 20 minutes, the reaction mixture was heated up to 40° C. and 461.06 g $MoO_3$ were added. The mixture was heated to 80° C. for 45 minutes. Then, the solution was cooled to room temperature and filtered.

pH 0.70
V(Ox)=4.90

The heteropolyacid solution was evaporated to 0.2 M concentration

Mo 16.9 g/100 g, P 1.0 g/100 g, V 6.5 g/100 g

Synthesis Example 5

Synthesis of $H_{17}P_3Mo_{14}V_{12}O_{88}$ 4000 ml deionized water and 661.25 g of aqueous $H_2O_2$-solution (30%) were cooled down to 4° C. At 4° C. 218.26 g of $V_2O_5$ were added within 1 minute while continuous stirring. After 30 minutes the mixture was warmed up to 18° C. and phosphoric acid (69.17 g, 85%) was added. After stirring for 20 minutes, the reaction mixture was heated up to 40° C. and 403.43 g $MoO_3$ were added. The mixture was heated to 80° C. for 45 minutes. Then, the solution was cooled to room temperature and filtered.

pH 0.94

The heteropolyacid solution was evaporated to 0.2 M concentration.

Mo 18.0 g/100 g, P 1.2 g/100 g, V 8.0 g/100 g

Synthesis Example 6

Synthesis of $H_{17}P_3Mo_{18}V_{12}O_{100}$ 4000 ml deionized water and 661.25 g of aqueous $H_2O_2$-solution (30%) were cooled down to 4° C. At 4° C. 218.26 g of $V_2O_5$ were added within 1 minute while continuous stirring. After 30 minutes the mixture was warmed up to 18° C. and phosphoric acid (69.17 g, 85%) was added. After stirring for 20 minutes, the reaction mixture was heated up to 40° C. and 518.70 g $MoO_3$ were added. The mixture was heated to 80° C. for 45 minutes. Then, the solution was cooled to room temperature and filtered.

pH 0.72

The heteropolyacid solution was evaporated to 0.2 M concentration.

Mo 21.8 g/100 g, P 1.2 g/100 g, V 7.5 g/100 g

Synthesis Example 7

Synthesis of $(NH_4)_9H_8P_3Mo_{16}V_{12}O_{94}$ 1000 ml deionized water and 165.31 g of aqueous $H_2O_2$-solution (30%) were cooled down to 4° C. At 4° C. 54.57 g of $V_2O_5$ were added within 1 minute while continuous stirring. After 30 minutes the mixture was warmed up to 18° C. and phosphoric acid (17.29 g, 85%) was added. After stirring for 20 minutes, the reaction mixture was heatedup 40° C. and 115.27 g $MoO_3$ were added. The mixture was heated to 80° C. for 45 minutes. The solution was cooled to room temperature and filtered.

After filtration the heteropolyacid was heated up to 70° C. 35.57 g $(NH_4)_2HPO_4$ were dissolved in 200 ml deionized water and dropwise added within 60 minutes to the heteropolyacid solution. The solution was cooled to room temperature and filtered.

pH 2.01
Mo 5.0 g/100 g, P 0.3 g/100 g, V 1.9 g/100 g, N 0.6 g/100 g

Synthesis Example 8

Synthesis of $(NH_4)_{12}H_5P_3Mo_{16}V_{12}O_{94}$ 1000 ml deionized water and 165.31 g of aqueous $H_2O_2$-solution (30%) were cooled down to 4° C. At 4° C. 54.57 g of $V_2O_5$ were added within 1 minute while continuous stirring. After 30 minutes the mixture was warmed up to 18° C. and phosphoric acid (17.29 g, 85%) was added. After stirring for 20 minutes, the reaction mixture was heated up to 40° C. and 115.27 g $MoO_3$ were added. The mixture was heated to 80° C. for 45 minutes. Then, the solution was cooled to room temperature and filtered.

After filtration the heteropolyacid was heated up to 70° C. 47.43 g $(NH_4)_2HPO_4$ were dissolved in 250 ml deionized water and dropwise added within 60 minutes to the heteropolyacid solution. The solution was cooled to room temperature and filtered.

pH 2.65
Mo 5.1 g/100 g, P 0.29 g/100 g, V 2.0 g/100 g, N 0.8 g/100 g

Synthesis Example 9

Synthesis of $(NH_4)_{4.6}H_{12.4}P_3Mo_{16}V_{12}O_{94}$ 1000 ml deionized water and 165.31 g of aqueous $H_2O_2$-solution (30%) were cooled down to 4° C. At 4° C. 54.57 g of $V_2O_5$ were added within 1 minute while continuous stirring. After 30 minutes, the mixture was warmed up to 18° C. and phosphoric acid (17.29 g, 85%) was added. After stirring for 20 minutes, the reaction mixture was heated up to 40° C. and 115.27 g MoO$_3$ were added. The mixture was heated to 80° C. for 45 minutes. Then, the solution was cooled to room temperature and filtered.

After filtration 1.16 l of the heteropolyacid was heated up to 70° C. 15.32 g (NH$_4$)$_2$HPO$_4$ were dissolved in 116 ml deionized water and dropwise added within 72 minutes to the heteropolyacid solution. The solution was cooled to room temperature and filtered.

pH 1.40

Mo 5.4 g/100 g, V 2.1 g/100 g, P 0.58 g/100 g, N<0.5 g/100 g

Examples 1-18 (Compositions of the Invention) and Comparative Examples C1-C6 (Comparative Composition)

A dispersion containing inorganic particles (A'), the heteropolyacid or a salt thereof (B1), and optionally the additive in de-ionized water was prepared, furnishing the CMP compositions of the examples 1-18, as specified in Table 1. Synthesis Examples 1-9 were used as heteropolyacid (B'). As a reference, dispersions in de-ionized water which does not comprise the heteropolyacid (B') or the inorganic particles (A') were used (comparative examples C1 and C6). Further comparative examples C2-C5 uses other types of heteropolyacids with A'. For all examples, the weight percentages (wt %), that are the weight of the corresponding components in percent of the total weight of the CMP composition, are given in Table 1. For all these examples, the pH was adjusted to 1.6 to 2 with HNO$_3$ if the pH was above 2.

General Procedure for the CMP Experiments

First trends of formulations were evaluated on 2 inch tungsten disc level using Buhler table polishers. For further evaluation and confirmation a 200 mm Strasbaugh 6EC polisher was used (polishing time was 60 s).

For the evaluation on benchtop following parameters were chosen:

Powerpro 5000 Bühler. DF=40 N, Table speed 150 rpm, Platen speed 150 rpm, slurry flow 200 ml/min, 20 s conditioning, 1 min polishing time, IC1000 pad, diamond conditioner (3M).

The pad is conditioned by several sweeps, before a new type of CMP composition is used for CMP. For the determination of removal rates at least 3 wafers are polished and the data obtained from these experiments are averaged.

The CMP composition is stirred in the local supply station.

The material removal rates (MRR) for 2 inch discs polished by the CMP composition are determined by difference of weight of the coated wafers before and after CMP, using a Sartorius LA310 S scale. The difference of weight can be converted into the difference of film thickness since the density (19.25 g/cm3 for tungsten) and the surface area of the polished material are known. Dividing the difference of film thickness by the polishing time provides the values of the material removal rate.

Data for the polishing performance of the CMP compositions of the examples 1-18 and of the comparative examples C1-C6 are given in the Table 1:

TABLE 1

Compositions of the examples 1-18 and of the comparative examples C1-C6 (Aqueous medium is water), material removal rates (MRR), selectivities and pH values in the CMP process using these compositions; MRR values with asterisk (*) = metal removal rates after polishing with a used pad

| Compositions | Inorganic Particles (A') | Heteropolyacid or a salt thereof (B') | MRR (tungsten) [Å/min] | pH |
|---|---|---|---|---|
| Example 1 | Colloidal silica AEROSIL ® 90 1 wt % | H$_{17}$P$_3$Mo$_{16}$V$_{10}$O$_{89}$ (Synthesis Example 1) 1 wt % | 865* | 1.7 |
| Example 2 | Colloidal silica AEROSIL ® 90 1 wt % | H$_{17}$P$_3$Mo$_{16}$V$_{12}$O$_{94}$ (Synthesis Example 2) 1 wt % | 873* | 1.7 |
| Example 3 | Colloidal silica AEROSIL ® 90 1 wt % | H$_{17}$P$_3$Mo$_{16}$V$_{14}$O$_{99}$ (Synthesis Example 3) 1 wt % | 908* | 1.7 |
| Example 4 | Colloidal silica AEROSIL ® 90 1 wt % | H$_{17}$P$_3$Mo$_{16}$V$_{12}$O$_{94}$ (Synthesis Example 2) 0.5 wt % | 573 | 2.0 |
| Example 5 | Colloidal silica AEROSIL ® 90 1 wt % | H$_{17}$P$_3$Mo$_{16}$V$_{12}$O$_{94}$ (Synthesis Example 4) 5 wt % | 1605 | 0.9 |
| Example 6 | Colloidal silica AEROSIL ® 90 1 wt % | H$_{17}$P$_3$Mo$_{14}$V$_{12}$O$_{88}$ (Synthesis Example 5) 1 wt % | 1217 | 2.0 |
| Example 7 | Colloidal silica AEROSIL ® 90 1 wt % | H$_{17}$P$_3$Mo$_{18}$V$_{12}$O$_{100}$ (Synthesis Example 6) 1 wt % | 1218 | 2.0 |
| Example 8 | Colloidal silica AEROSIL ® 90 1 wt % | H$_{17}$P$_3$Mo$_{16}$V$_{12}$O$_{94}$ (Synthesis Example 2) 1 wt % | 1155 | 2.0 |
| Example 9 | Colloidal silica AEROSIL ® 90 1 wt % | (NH$_4$)$_{4.6}$H$_{12.4}$P$_3$Mo$_{16}$V$_{12}$O$_{94}$ (Synthesis Example 9) 1 wt % | 1090 | 2.0 |
| Example 10 | Colloidal silica AEROSIL ® 90 1 wt % | (NH$_4$)$_9$H$_8$P$_3$Mo$_{16}$V$_{12}$O$_{94}$ (Synthesis Example 7) 1 wt % | 1082 | 2.0 |
| Example 11 | Colloidal silica AEROSIL ® 90 1 wt % | (NH$_4$)$_{12}$H$_5$P$_3$Mo$_{16}$V$_{12}$O$_{94}$ (Synthesis Example 8) 1 wt % | 1332 | 2.0 |

TABLE 1-continued

Compositions of the examples 1-18 and of the comparative examples C1-C6 (Aqueous medium is water), material removal rates (MRR), selectivities and pH values in the CMP process using these compositions; MRR values with asterisk (*) = metal removal rates after polishing with a used pad

| Compositions | Inorganic Particles (A') | Heteropolyacid or a salt thereof (B') | MRR (tungsten) [Å/min] | pH |
|---|---|---|---|---|
| Example 12 | Colloidal silica AEROSIL® 90 1 wt % | $(NH_4)_{4.6}H_{12.4}P_3Mo_{16}V_{12}O_{94}$ (Synthesis Example 9) 1 wt % | 803* | 2.0 |
| Example 13 | Colloidal silica NexSil™ 85K 1 wt % | $(NH_4)_{4.6}H_{12.4}P_3Mo_{16}V_{12}O_{94}$ (Synthesis Example 9) 1 wt % | 915* | 2.0 |
| Example 14 | Colloidal silica NexSil™ 125K 1 wt % | $(NH_4)_{4.6}H_{12.4}P_3Mo_{16}V_{12}O_{94}$ (Synthesis Example 9) 1 wt % | 970* | 2.0 |
| Example 15 | Colloidal silica NexSil™ 5 1 wt % | $(NH_4)_{4.6}H_{12.4}P_3Mo_{16}V_{12}O_{94}$ (Synthesis Example 9) 1 wt % | 714* | 2.0 |
| Example 16 | Colloidal silica NexSil™ 125A 1 wt % | $(NH_4)_{4.6}H_{12.4}P_3Mo_{16}V_{12}O_{94}$ (Synthesis Example 9) 1 wt % | 1085* | 2.0 |
| Example 17 | Colloidal silica NexSil™ 125NH4 1 wt % | $(NH_4)_{4.6}H_{12.4}P_3Mo_{16}V_{12}O_{94}$ (Synthesis Example 9) 1 wt % | 1067* | 2.0 |
| Example 18 | Colloidal silica LEVASIL® 100 1 wt % | $(NH_4)_{4.6}H_{12.4}P_3Mo_{16}V_{12}O_{94}$ (Synthesis Example 9) 1 wt % | 1041* | 2.0 |
| Comparative Example C1 | Colloidal silica AEROSIL® 90 5 wt % | none | 18 | 6.0 |
| Comparative Example C2 | Colloidal silica AEROSIL® 90 4 wt % | $H_3PMo_{12}O_{40}$ 1 wt % | 176 | 2.0 |
| Comparative Example C3 | Colloidal silica AEROSIL® 90 4 wt % | $H_4SiMo_{12}O_{40}$ 1 wt % | 106 | 2.0 |
| Comparative Example C14 | Colloidal silica AEROSIL® 90 1 wt % | $H_5PMo_{10}V_2O_{40}$ 1 wt % | 497 | 1.7 |
| Comparative Example C5 | Colloidal silica AEROSIL® 90 1 wt % | $H_7PMo_8V_4O_{40}$ 1 wt % | 681 | 1.7 |
| Comparative Example C6 | None | $H_{17}P_3Mo_{16}V_{10}O_{89}$ 1 wt % | 176 | |

These examples of the CMP compositions of the invention improve the polishing performance Analytical data of PVM-1-11 from Nippon Inorganic Colour & Chemical Co., Ltd.

PVM-1-11 from Nippon Inorganic Colour & Chemical Co., Ltd. is a heteropolyacid which was used for example in JP-A-2005-223257 in an aqueous dispersion appropriate for the CMP of copper substrates. According to the elementary analysis of Mo, P and V, which was done by ICP-OES (inductively coupled plasma optical emission spectrometry), the values determined for PVM-1-11 were molybdenum (Mo) 49 g/100 g substance
phosphorus (P) 1.6 g/100 g substance
vanadium (V) 2.3 g/100 g substance, thus PVM-1-11 has the formula $H_4P_1Mo_{11}V_1O_{40}$, and if normalized to $P_3$, PVM-1-11 has the formula $H_{12}P_3Mo_{33}V_3O_{120}$.

The invention claimed is:

1. A chemical-mechanical polishing CMP composition, comprising:
   (A) inorganic particles, organic particles, or a mixture thereof,
   (B) a heteropolyacid of empirical formula I:

$H_aX_bP_3Mo_yV_zO_c$ wherein X is a cation other than H, $8 \leq y \leq 18$ $8 \leq z \leq 14$ $56 \leq c \leq 105$ $a+b=2c-6y-5(3+z)$ $b \geq 0$, and $a > 0$, or a salt thereof, and
   (C) an aqueous medium.

2. The CMP composition according to claim 1, wherein (A) are inorganic particles.

3. The CMP composition according to claim 1, wherein (B) is a heteropolyacid of empirical formula II:

$H_aX_bP_3Mo_yV_zO_c$ wherein X is a cation other than H, $12 \leq y \leq 18$ $10 \leq z \leq 14$ $85 \leq c \leq 100$ $a+b=2c-6y-5(3+z)$ $b \geq 0$, and $a > 0$, or a salt thereof.

4. The CMP composition according to claim 1, wherein (B) is a heteropolyacid of empirical formula III:

$$H_a X_b P_3 Mo_y V_z O_c$$

wherein X is an organic or inorganic ammonium cation, $14 \leq y \leq 18$ $10 \leq z \leq 14$ $88 \leq c \leq 100$ $a + b = 2c - 6y - 5(3+z)$ $b \geq 0$, and $a > 0$.

5. The CMP composition according to claim 1, wherein X in the formula I of (B) is an inorganic or organic ammonium cation.

6. The CMP composition according to claim 1, wherein X in the formula I of (B) is an $NH_4^+$ cation.

7. The CMP composition according to claim 1, wherein (A) are silica.

8. The CMP composition according to claim 1, wherein (A) have a mean particle size of from 5 to 250 nm.

9. The CMP composition according to claim 1, wherein the heteropolyacid or the salt thereof (B) is present in a concentration of from 0.1% to 5% by weight of the CMP composition.

10. The CMP composition according to claim 1, wherein the CMP composition has a pH value of from 0 to 3.5.

11. A process for manufacturing semiconductor devices, the process comprising chemical-mechanically polishing a substrate in the presence of the CMP composition according to claim 1.

12. The process according to claim 11, wherein the substrate comprises at least one of a tungsten layer and a copper layer.

13. A process for preparing the CMP composition according to claim 1, the process comprising: in the aqueous medium (c),
dispersing the particles (A), and
dispersing or dissolving the heteropolyacid or the salt thereof (B).

14. A method for polishing a substrate comprising a metal layer, the method comprising: applying the CMP composition according to claim 1 to the substrate in need thereof.

15. The method according to claim 14, wherein the metal layer is at least one of a tungsten layer and a copper layer.

* * * * *